United States Patent
Ali

(10) Patent No.: US 8,115,518 B1
(45) Date of Patent: Feb. 14, 2012

(54) INTEGRATED CIRCUIT FOR REDUCING NONLINEARITY IN SAMPLING NETWORKS

(75) Inventor: Ahmed Mohamed Abdelatty Ali, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/856,820

(22) Filed: Aug. 16, 2010

(51) Int. Cl.
*G11C 27/02* (2006.01)
*H03K 17/16* (2006.01)

(52) U.S. Cl. ............ 327/91; 327/94; 327/390; 327/391; 327/589

(58) Field of Classification Search .................. None
See application file for complete search history.

(56) References Cited

U.S. PATENT DOCUMENTS

| | | | | |
|---|---|---|---|---|
| 5,084,634 A * | 1/1992 | Gorecki | ........................ | 327/91 |
| 5,172,019 A * | 12/1992 | Naylor et al. | ................. | 327/390 |
| 5,422,583 A * | 6/1995 | Blake et al. | ..................... | 327/94 |
| 6,265,911 B1 * | 7/2001 | Nairn | ............................... | 327/94 |
| 6,329,848 B1 * | 12/2001 | Maes et al. | ..................... | 327/94 |
| 6,396,325 B2 * | 5/2002 | Goodell | ........................ | 327/308 |
| 6,525,574 B1 * | 2/2003 | Herrera | .......................... | 327/94 |
| 6,693,479 B1 * | 2/2004 | Bardsley | ...................... | 327/390 |
| 7,183,814 B2 * | 2/2007 | Kudo | .............................. | 327/91 |
| 7,453,291 B2 * | 11/2008 | Song | ............................... | 327/91 |

\* cited by examiner

*Primary Examiner* — Tuan T Lam
(74) *Attorney, Agent, or Firm* — Kenyon & Kenyon LLP

(57) ABSTRACT

An integrated circuit allows for the correction of distortion at an input of a sampling network. The integrated circuit contains a first bootstrap circuit to drive a sampling network transistor and a second bootstrap circuit to separate the back-gate terminal of the transistor from a voltage input by a resistance inserted in series. The presence of the inserted resistance counteracts the effect of the nonlinear back-gate capacitance on the distortion at the input.

15 Claims, 2 Drawing Sheets

INTEGRATED CIRCUIT FOR REDUCING NONLINEARITY IN SAMPLING NETWORKS

FIELD OF THE INVENTION

The present invention relates to a sampling network. The present invention further relates to an integrated circuit that corrects a distortion at the input of a sampling network. The present invention further relates to a circuit that reduces nonlinearity in a sampling network resulting from a back-gate capacitance of a MOSFET device in the network.

BACKGROUND INFORMATION

Sampling networks may be used for a variety of uses, such as digital filtering, analog-to-digital conversion, digital-to-analog conversion, or sampling inputs with sample and hold (or track and hold) circuits. In a particular sampling network, a plurality of input signals are sampled onto an array of capacitors, sample and hold circuits, or track and hold circuits, depending on the configuration of the network. The stored signal may then be converted or filtered based on the design of the network.

Sampling networks have a number of drawbacks which do not allow for ideal operation. An example of one such drawback is distortion that is produced from various circuit elements within the network. In a sampling network that uses track and hold circuits, the input switch may be an initial source of distortion for the sampling network. This may occur in the network regardless of whether the circuit is in a track phase (where the tracking capacitors are being charged) or the circuit is in the hold phase (where the charge is held on the capacitors).

Additionally, all sampling networks, regardless of the configuration, have other sources of distortion. A particular high source of distortion in sampling networks occurs at the voltage sampled at a sampling capacitor. This is generally a result of the presence of a nonlinear resistor used in the sampling network which may be voltage dependent and thus cause distortion at the output of a sampled capacitor. Nonlinear parasitic capacitance may additionally contribute to the distortion at the sampled capacitor. One method to correct this distortion is to use a bootstrap circuit to "bootstrap" the devices in the sampling network. A bootstrap circuit that is connected to an input switch can pull up the current through the input switch and keep the gate-to-source and the back-gate-to-source voltages constant, and effectively eliminate a variation of the resistance of the nonlinear resistor from varying the input voltage. The use of a bootstrap circuit has the additional benefit of causing a reduction in a variation of a switch resistor with the input voltage.

The use of bootstrap circuits however, may lead to unwanted residual effects. For example, in a bootstrap circuit using MOSFET devices, bootstrapping a back-gate of a MOSFET device would lead to an unwanted junction capacitance at the input of the sampling network. This additional capacitance introduces nonlinearity at the input that may degrade the performance of the sampling network. Thus there remains a need in the art, for an integrated circuit which may improve linearity at the input of a sampling network, without leading to additional distortion.

DETAILED DESCRIPTION

The subject invention will now be described in detail for specific preferred embodiments of the invention, it being understood that these embodiments are intended only as illustrative examples and the invention is not to be limited thereto.

Nonlinearity and distortion in a sampling network may be overcome by an integrated circuit that introduces additional series resistance into a sampling network. Embodiments of the present invention provide a pair of bootstrap circuits which may be coupled to a sampling network (such as an analog to digital converter), and a resistive element which may be connected between the input and a back-gate switch of the sampling network.

Figure 1:
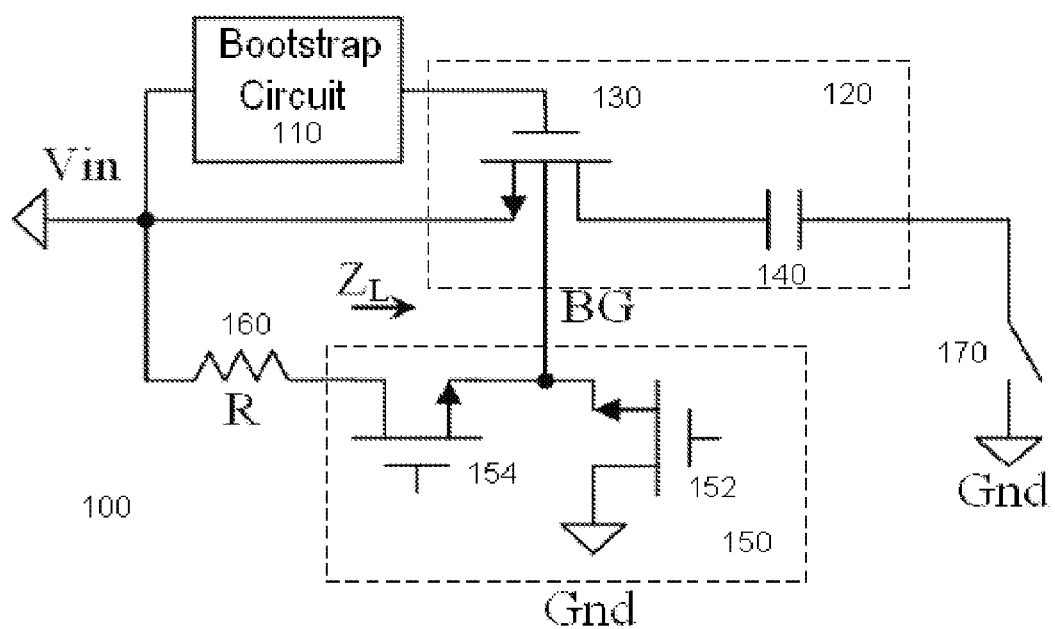
FIG. 1 is a diagram of the integrated circuit with multiple bootstrap circuits coupled to a sampling network.

FIG. 1 illustrates an integrated circuit of the present invention. Integrated circuit 100 may contain a sampling network 120 coupled to bootstrap circuit 110. Sampling network 120 may contain a transistor 130 and a sampling capacitor 140. Transistor 130 may be any three-terminal transistor such as an nMOS device. The gate of transistor 130 may be coupled to the output of bootstrap circuit 110. The input of bootstrap circuit 110 may be connected to a voltage input terminal. For ease of illustration, the details of bootstrap circuit 110 are not depicted.

Transistor 130 may be coupled to the voltage input terminal at the source terminal of the transistor, tying the source to the input. The source terminal of transistor 130 may have a representative source impedance, $Z_S$, which is not shown. As bootstrap circuit 110 is directly connected to the voltage input terminal, the output of the bootstrap circuit 110 will vary with a change to $V_{in}$, and the gate-to-source voltage of transistor 130 may remain fixed. The drain terminal of transistor 130 may be coupled to capacitor 140. Capacitor 140 may be connected to a switch 170, which may connect and disconnect the sampling capacitor to ground.

The back-gate of transistor 130 may be coupled to bootstrap circuit 150. Bootstrap circuit 150 may contain two transistors, 152, 154. Transistors 152 and 154 may also be any nMOS devices. The source terminals of transistors 152 and 154 may be coupled together and tied to the back-gate of transistor 130 of the sampling network. The drain terminal of transistor 152 may be coupled to ground, and the drain terminal of transistor 154 may be coupled to resistor 160, which may be a variable resistor. Resistor 160 may be coupled to the voltage input terminal. In an embodiment, resistor 160 may be between 300 ohms to 1 kilohm. A resistance value that is significantly larger than 1 kilohm may actually degrade the performance of the sampling network and reduce an effectiveness of the bootstrapping of the back-gate by bootstrap circuit 150.

During a sampling phase, an input signal ($V_{in}$) is applied to the source terminal of transistor 130. During this phase, the input signal is also applied to an input of bootstrap circuit 110 which may output a bootstrap voltage which may be greater than $V_{in}$ to the gate terminal of transistor 130. As the voltage of the gate terminal of may be greater than the voltage at the source terminal, the gate-to-source voltage ("$V_{GS}$") of transistor 130 may be greater than a threshold voltage ("$V_{TH}$"), and transistor 130 may turn on. When transistor 130 is on, a channel is open between the drain and the source of the transistor, and the input signal may be applied to capacitor 140. Switch 170 may close, connecting a bottom plate of capacitor 140 to ground.

Transistor 154 may also turn on and operate in a linear region when the input signal is applied. Alternately during this phase, transistor 152 may be off. When transistor 154 is on, resistor 160 may be connected to the back-gate of transistor 130. Resistor 160 may isolate the back-gate from the input signal and from the source terminal of transistor 130.

When the capacitor plates of capacitor 140 have a differential voltage equal to $V_{in}$, switch 170 may open. During this disconnecting phase, the voltage at the drain terminal of transistor 130 may be equal to $V_{in}$ and the drain-to-source voltage may be zero. Bootstrap circuit 110 may output a lower voltage to transistor 130, where the gate-source voltage may be less than the threshold voltage. Transistor 130 may turn off, disconnecting capacitor 140 from the input.

During this disconnecting phase, transistor 154 may turn off, disconnecting the back-gate of transistor 130 from the input signal. Transistor 152 may turn off, connecting the back-gate of transistor 130 to ground.

The insertion of resistor 160 between the voltage input terminal and bootstrap circuit 150 may decrease the nonlinearity at the voltage input during operation, which is created by the nonlinear capacitance, $C_P$, in the back-gate of transistor 130. This may be demonstrated by modeling the input voltage in terms of transistor 130 and resistor 160, which may be represented by equation (i):

$$V_{in} = \frac{V_s Z_L (1 + sC_p R)}{(Z_s + Z_L)\left[1 + sC_p\left(\left(\frac{Z_s Z_L}{Z_s + Z_L}\right) + R\right)\right]} \quad (i)$$

where $Z_L$ is the impedance of sampling capacitor 160 and switch 170, $Z_S$ is the source impedance of transistor 130, $V_S$ is the source voltage of transistor 130, R is the resistance of resistor 160, and $C_P$ is the back-gate nonlinear capacitance of transistor 130 scaled by a factor S.

The relative distortion of the input voltage may further be modeled by the equation:

$$\frac{\delta V_{in}}{V_{in}} = \frac{-s\delta C_p\left(\frac{Z_s Z_L}{Z_s + Z_L}\right)}{(1 + sC_p R)\left[1 + sC_p\left(\left(\frac{Z_s Z_L}{Z_s + Z_L}\right) + R\right)\right]} \quad (ii)$$

where $$\frac{\delta V_{in}}{V_{in}}$$

is the relative distortion of the input voltage, and $\delta C_p$ is the distortion of the nonlinear capacitance of the back-gate of transistor 130.

As demonstrated by equation (ii), $$\frac{\delta V_{in}}{V_{in}}$$

is inversely proportional to R, and therefore the relative distortion of the input voltage may decrease if the resistance of resistor 160 is increased. If resistor 160 is removed, R=0, and the relative distortion of the input voltage may be entirely dependent on the nonlinear back-gate capacitance $C_P$, as shown in equation (iii):

$$\frac{\delta V_{in}}{V_{in}} = \frac{-s\delta C_p\left(\frac{Z_s Z_L}{Z_s + Z_L}\right)}{\left(1 + sC_p\left(\frac{Z_s Z_L}{Z_s + Z_L}\right)\right)} \quad (iii)$$

Absent resistor 160, a distortion that is dependent on nonlinear back-gate capacitance $C_P$ may worsen. An input with a high frequency may also adversely affect the distortion at the voltage input terminal of a typical sampling voltage, creating a capacitive high-pass filter, in the absence of resistor 160. Inserting resistor 160 between the back-gate of transistor 130 and the voltage input terminal may convert the capacitive high-pass filter to a low-pass filter response. If R is increased and thus the distortion is decreased, the corresponding frequency may also decrease.

Although resistor 160 may reduce distortion due to nonlinearity from the back-gate capacitance in transistor 130, other sources of distortion at the input may occur. These sources may include a switch resistance variation that occurs between the gate voltage and the back-gate voltage of transistor 130. These sources may be corrected directly by bootstrap circuit 110 and bootstrap circuit 150.

Figure 2:
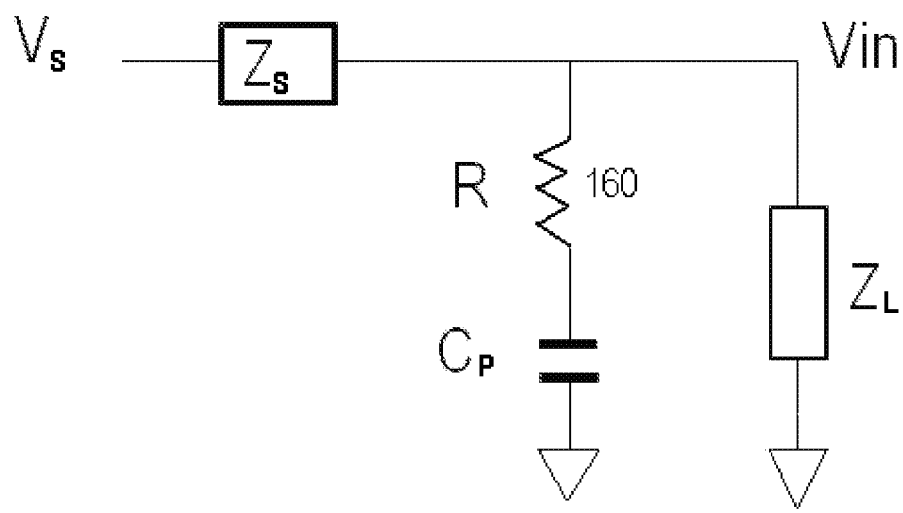
FIG. 2 is an equivalent diagram of the integrated circuit coupled with a sampling network.

The technique described herein may be used in any other sampling network where any nonlinear capacitance is generated in a signal path from an input voltage. FIG. 2 illustrates an equivalent diagram of the resistor insertion technique of the present invention embodied in FIG. 1. $V_S$ may represent the voltage at the source of a MOSFET device in a sampling network and $Z_S$ may represent the impedance at the source of the MOSFET device. The source impedance may be coupled to the input voltage. Resistor 160 may be coupled to the input voltage and to a nonlinear capacitance $C_p$ of the MOSFET device. $C_p$ may be connected to ground and may be in series with resistor 160. Resistor 160 and nonlinear capacitance $C_p$ may be connected in parallel with a load impedance $Z_L$, where the load impedance may be the impedance of connected sampling capacitors.

Several embodiments of the invention are specifically illustrated and/or described herein. However, it will be appreciated that modifications and variations of the invention are covered by the above teachings and within the purview of the appended claims without departing from the spirit and intended scope of the invention.

What is claimed is:

1. An integrated circuit that corrects distortion at an input of a sampling network due to nonlinear capacitance, comprising:
   a voltage input terminal;
   a resistor connected at a first end to the voltage input terminal; and
   first and second bootstrap circuits, the first bootstrap circuit being connected to the voltage input terminal and applying a driving voltage to a transistor in the sampling network, the second bootstrap circuit connecting a back-gate terminal of the transistor to a second end of the resistor.

2. The integrated circuit according to claim 1, further comprising a capacitor that is coupled to a drain terminal of the transistor, the capacitor sampling an applied input signal when the transistor is on.

3. The integrated circuit according to claim 2, further comprising a switch coupled to a bottom plate of the capacitor, the switch closing when the capacitor samples the applied input signal.

4. The integrated circuit according to claim 1, wherein the second bootstrap circuit includes a first and second bootstrap transistor.

5. The integrated circuit according to claim 1, wherein the voltage input terminal is coupled to a source terminal of the transistor.

6. The integrated circuit according to claim 1, wherein the first bootstrap circuit applies the driving voltage to a gate terminal of the transistor.

7. The integrated circuit according to claim 1, wherein the resistor is a variable resistor.

8. The integrated circuit according to claim 1, wherein the transistor is an nMOS device.

9. The integrated circuit according to claim 4, wherein the first and second bootstrap transistors turn on alternately.

10. The integrated circuit according to claim 4, wherein the first and second bootstrap transistors are coupled together at source terminals of the first and second bootstrap transistors.

11. The integrated circuit according to claim 4, wherein a drain terminal of the first bootstrap transistor is coupled to the resistor.

12. The integrated circuit according to claim 4, wherein the first and second bootstrap transistors are nMOS devices.

13. The integrated circuit according to claim 10, wherein the source terminals of the first and second bootstrap transistors are coupled to the back-gate terminal of the transistor in the sampling network.

14. A method for reducing distortion at an input of a sampling network due to nonlinear capacitance, comprising:
    applying an input signal to the sampling network;
    bootstrapping a transistor in the sampling network by applying a driving voltage to a gate of the transistor;
    turning on the transistor in the sampling network;
    storing a voltage from the input signal on a sampling capacitor;
    bootstrapping a back-gate terminal in the transistor; and
    isolating the back-gate terminal of the transistor with a variable resistor, the variable resistor includes a resistor connected at a first end to the input and at a second end to the back-gate terminal of the transistor through a bootstrap circuit.

15. The method according to claim 14, wherein the input signal is disconnected from the sampling capacitor when the transistor is turned off.

* * * * *